(12) United States Patent
Huang et al.

(10) Patent No.: US 11,056,549 B2
(45) Date of Patent: Jul. 6, 2021

(54) ACTIVE MATRIX ORGANIC LIGHT EMITTING DIODE PANEL

(71) Applicant: WUHAN CHINA STAR OPTOELECTRONICS SEMICONDUCTOR DISPLAY TECHNOLOGY CO., LTD., Hubei (CN)

(72) Inventors: Weijie Huang, Hubei (CN); Peng Li, Hubei (CN)

(73) Assignee: Wuhan China Star Optoelectronics Semiconductor Display Technology Co., Ltd., Hubei (CN)

( * ) Notice: Subject to any disclaimer, the term of this patent is extended or adjusted under 35 U.S.C. 154(b) by 0 days.

(21) Appl. No.: 16/619,095

(22) PCT Filed: Mar. 18, 2019

(86) PCT No.: PCT/CN2019/078538
§ 371 (c)(1),
(2) Date: Dec. 4, 2019

(87) PCT Pub. No.: WO2020/124826
PCT Pub. Date: Jun. 25, 2020

(65) Prior Publication Data
US 2020/0335561 A1 Oct. 22, 2020

(51) Int. Cl.
*H01L 27/32* (2006.01)
*H01L 51/52* (2006.01)
*H01L 51/56* (2006.01)

(52) U.S. Cl.
CPC ...... *H01L 27/3246* (2013.01); *H01L 27/3218* (2013.01); *H01L 27/3276* (2013.01);
(Continued)

(58) Field of Classification Search
None
See application file for complete search history.

(56) References Cited

U.S. PATENT DOCUMENTS 6,961,029 B1 * 11/2005 Canova, Jr. ........... G02F 1/1362
345/55
9,786,721 B1 * 10/2017 Tang .................. H01L 27/3246
(Continued)

FOREIGN PATENT DOCUMENTS

CN 107942564 A 4/2018
CN 108565281 A 9/2018

OTHER PUBLICATIONS

Pentile OLEDs: Introduction and Market Status, Feb. 10, 2019 downloaded from URL<https://www.oled-info.com/pentile> on Nov. 20, 2020. (Year: 2019).*

*Primary Examiner* — J. E. Schoenholtz
(74) *Attorney, Agent, or Firm* — Mark M. Friedman

(57) ABSTRACT

The present disclosure provides an active matrix organic light emitting diode panel where a color shift does not occur at an edge of a display area. A color shift does not occur at the edge of the display area in an AMOLED panel proposed by an embodiment of the present disclosure to avoid color shift phenomenon at the edge of a display area. So red, green, and blue (R, G, and B) pixel units that are not arranged in a regular pattern at a non-standard pixel structure and a corresponding anode material layer are in a floating state. So the color shift phenomenon will not occur. When the pixel unit of the non-standard pixel structure receives an image display control signal, the color shift phenomenon may occur due to the inability to correspondingly display a corresponding image corresponding to the image display control signal to display the screen normally.

9 Claims, 5 Drawing Sheets

(52) U.S. Cl.
CPC .......... *H01L 51/5212* (2013.01); *H01L 51/56* (2013.01); *H01L 2227/323* (2013.01)

(56) References Cited

U.S. PATENT DOCUMENTS

| | | | |
|---|---|---|---|
| 10,379,411 B2* | 8/2019 | Hirata | G02F 1/136286 |
| 2009/0102824 A1* | 4/2009 | Tanaka | G09G 3/3648 |
| | | | 345/205 |
| 2014/0072729 A1* | 3/2014 | Zheng | C23F 1/14 |
| | | | 428/1.1 |
| 2018/0075797 A1* | 3/2018 | Park | G09G 3/2092 |
| 2018/0190190 A1* | 7/2018 | Xi | G09G 3/3225 |
| 2018/0204889 A1* | 7/2018 | Yu | H01L 27/3276 |
| 2018/0315357 A1* | 11/2018 | Nam | H01L 27/3223 |
| 2019/0035352 A1* | 1/2019 | Bei | G02F 1/136286 |

* cited by examiner

ACTIVE MATRIX ORGANIC LIGHT EMITTING DIODE PANEL

BACKGROUND

1. Field of the Disclosure

The present disclosure relates to the field of active matrix organic light emitting diode (AMOLED) display technology, and more particularly, to an AMOLED panel where a color shift does not occur at the edge of a display area.

2. Description of the Related Art

Compared with a liquid crystal display (LCD) screen of the related art, the advantages of an AMOLED screen is fast response, self-illumination, wide viewing angle, good display effect, and low power consumption. An AMOLED is also suitable for a flexible curved panel. To beautify the panel better, the screen ratio is designed to be larger, and a round corner is adopted for the flexible curved panel. However, a color shift occurs at the round-corner edge when a round corner is adopted in the flexible curved panel.

When the red (R), green (G), and blue (B) pixel units are regularly arranged in a R, G, B, and G diamond layout, the AMOLED panel in a straight edge design of the related art can use image calculus at the edge of the straight edge to improve the color shift phenomenon. However, when the AMOLED panel uses the round-corner design, due to the problem of the radius of the round corner and the curvature of the round corner, the arrangement of the R, G, and B pixel units at the round-corner edge is not necessarily regular. Therefore, when a color shift phenomenon occurs, it is not easy to use an image algorithm to improve the color shift phenomenon simply.

Therefore, it is necessary to propose a new AMOLED panel to amend the defect that a color shift occurs on the AMOLED panel of the related art in a round-corner design.

SUMMARY

Technical Problem

The purpose of the present disclosure is to propose an AMOLED panel where a color shift does not occur at the edge of the display area to amend the defect that a color shift occurs at the edge of the display area in the AMOLED panel of the related art.

Technical Solution

According to the present disclosure, an active matrix organic light emitting diode (AMOLED) panel where a color shift does not occur at an edge of a display area, includes a substrate, a standard pixel structure, and a non-standard pixel structure.

The standard pixel structure includes:
a first poly-silicon and gate layer is formed on the substrate;
a first interlayer insulating layer, formed on the first poly-silicon and gate layer; a first hole being formed in an area corresponding to the first interlayer insulating layer, the first poly-silicon and gate layer, the first source layer, and the first drain layer; the first source layer and the first drain layer being formed in the first hole corresponding to the first interlayer insulating layer and extending outside the first hole;

a first planar layer, formed on the first interlayer insulating layer, the first source layer, and the first drain layer; the first planar layer covering the first interlayer insulating layer, the first source layer, and the first drain layer; a second hole formed in the area corresponding to the first drain layer on the first planar layer;

a first anode material layer, formed on the first planar layer, extending through the second hole, and electrically connected to the first drain layer;

a first pixel defining layer, formed on the first anode material layer and covering only a portion of the first anode material layer.

The non-standard pixel structure includes:
a second poly-silicon and gate layer is formed on the substrate;
a second interlayer insulating layer being formed on the second poly-silicon and gate layer; a third hole being formed in the area corresponding to the second interlayer insulating layer, the second poly-silicon and gate layer, the second source layer, and the second drain layer; the second source layer and the second drain layer being formed in the third hole corresponding to the second interlayer insulating layer and extending outside the third hole;

a second planar layer, formed on the second interlayer insulating layer, the second source layer, and the second drain layer; the second planar layer covering the second interlayer insulating layer, the second source layer, and the second drain layer;

a second anode material layer, formed on the second planar layer;

a second pixel defining layer, formed on the second anode material layer; the second pixel defining layer, covering a portion of the second anode material layer only.

Furthermore, red (R), green (G), and blue (B) pixel units in the standard pixel structure are arranged in a regular pattern.

Furthermore, red (R), green (G), and blue (B) pixel units in the non-standard pixel structure are arranged in an irregular pattern.

Furthermore, the non-standard pixel structure lacks one or more of the R, G, and B pixel units.

Furthermore, the display area of the AMOLED panel comprises a non-straight edge.

Furthermore, the non-standard pixel structure is arranged at the non-straight edge.

Furthermore, the non-standard pixel structure is a round-corner edge.

Furthermore, the substrate is made of a polyimide (PI) material.

Furthermore, the first hole, the second hole, and the third hole are formed in an etching process.

Furthermore, the first anode material layer and the second anode material layer are both made of indium tin oxide (ITO).

Advantageous Effect

A color shift does not occur at the edge of the display area in an AMOLED panel proposed by an embodiment of the present disclosure to avoid color shift phenomenon at the edge of a display area. So red, green, and blue (R, G, and B) pixel units that are not arranged in a regular pattern at a non-standard pixel structure and a corresponding anode material layer are in a floating state. So the color shift phenomenon will not occur. When the pixel unit of the non-standard pixel structure receives an image display control signal, the color shift phenomenon may occur due to the inability to correspondingly display a corresponding image corresponding to the image display control signal to display the screen normally. The problem of the color shift phenomenon is resolved. Moreover, the structure proposed by the embodiment of the present disclosure is simple and effective in design, which meets industrial production requirements without an increase in production cost.

BRIEF DESCRIPTION OF THE DRAWINGS

The accompanying figures to be used in the description of embodiments of the present disclosure or prior art will be described in brief to more clearly illustrate the technical solutions of the embodiments or the prior art. The accompanying figures described below are only part of the embodiments of the present disclosure, from which figures those skilled in the art can derive further figures without making any inventive efforts.

DETAILED DESCRIPTION OF THE EMBODIMENTS

In the description of this specification, the description of the terms "one embodiment", "some embodiments", and the like, means to refer to the specific feature, structure, material or characteristic described in connection with the embodiments or examples being included in at least one embodiment or example of the present disclosure. In the present specification, the term of the above schematic representation is not necessary for the same embodiment or example. Furthermore, the specific feature, structure, material, or characteristic described may be in combination in a suitable manner in any one or more of the embodiments or examples. In addition, it will be apparent to those skilled in the art that different embodiments or examples described in this specification, as well as features of different embodiments or examples, may be combined without contradictory circumstances.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures.

Figure 1:
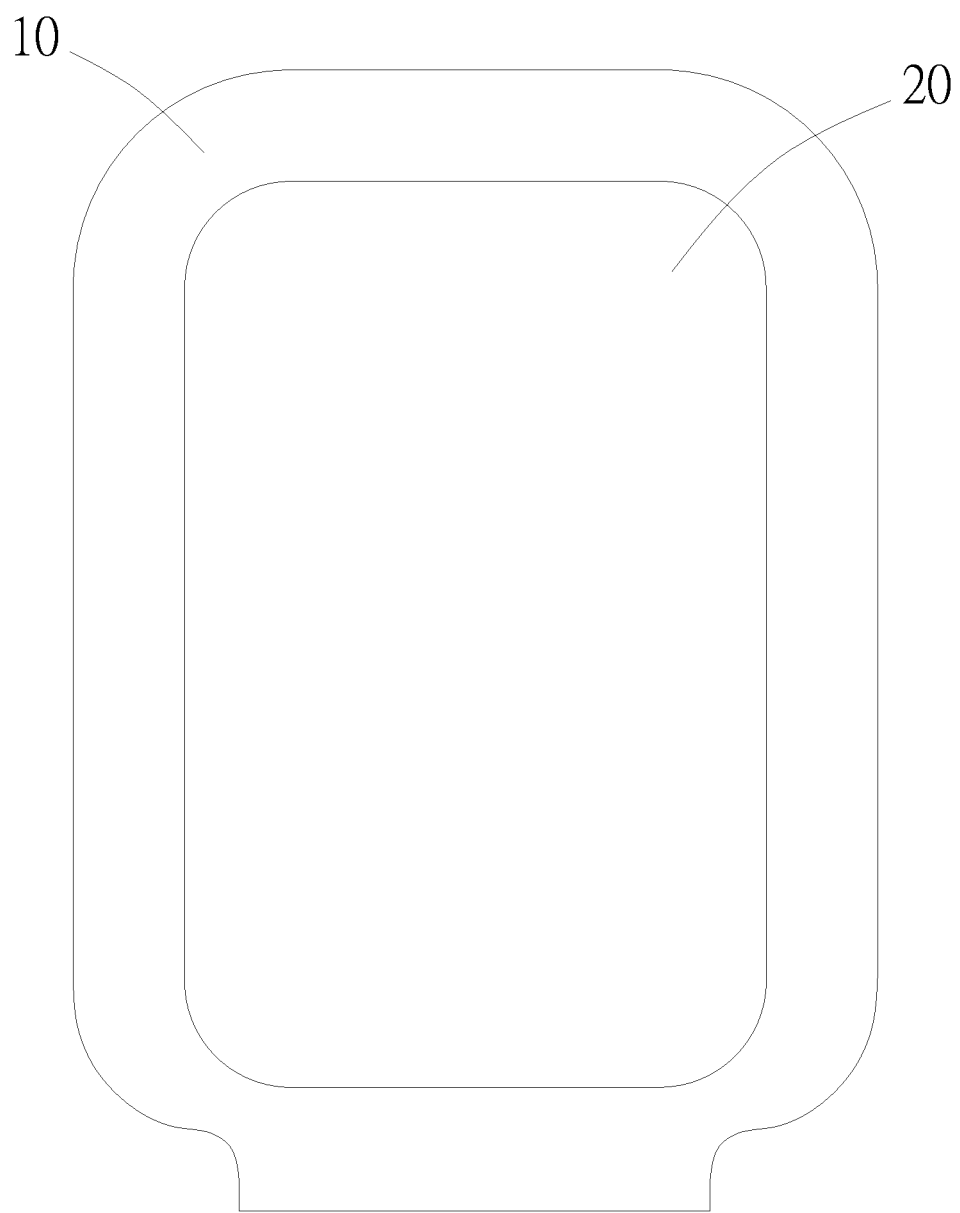
FIG. 1 is a schematic structural diagram of an active matrix organic light emitting diode (AMOLED) display panel according to a first embodiment of the present disclosure.
Figure 2:
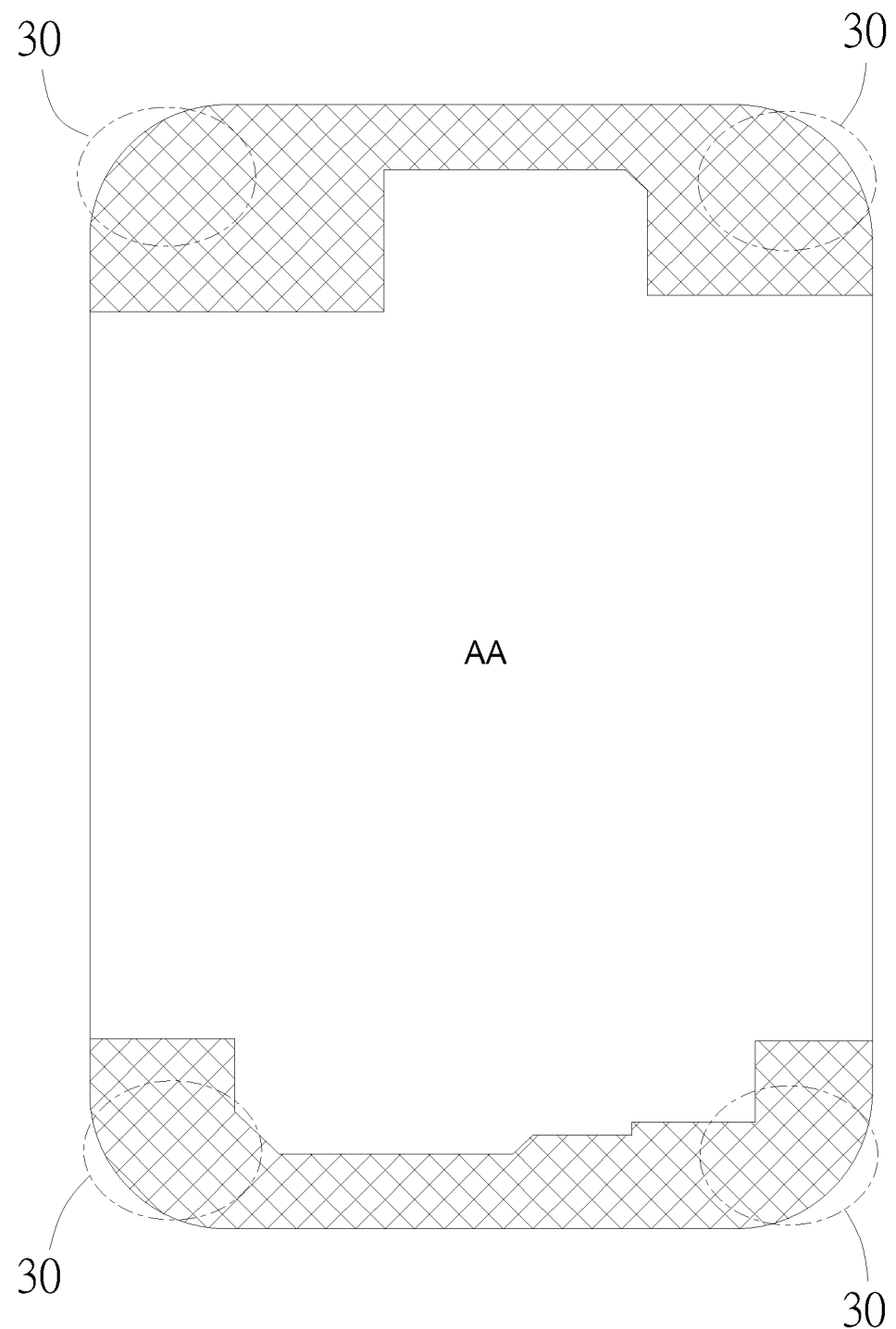
FIG. 2 is a schematic diagram of a pixel structure of a round-corner edge of the AMOLED display panel.

FIG. 1 is a schematic structural diagram of an active matrix organic light emitting diode (AMOLED) display panel according to a first embodiment of the present disclosure. FIG. 2 is a schematic diagram of a pixel structure of a round-corner edge of the AMOLED display panel. A substrate 10 of the AMOLED display panel includes an active zone 20. The active zone 20 includes a plurality of red (R), green (G), blue (B) pixel units arranged in sets. The R, G, and B pixel units are configured to receive an active matrix circuit control to display a corresponding image. The AMOLED display panel of the present embodiment adopts a round-corner edge. The pixel structure at the round-corner edge may not be arranged regularly as the arrangement of the R, G, and B pixel units which are not arranged at the round-corner edge are arranged due to the factor of the radius of the round corner and the curvature of the round corner. Thus, to elaborate the present embodiment, the R, G, and B pixel units which are arranged at the round-corner edge is defined as standard pixel units, and the R, G, and B pixel units positioned at the round-corner edge is defined as non-standard pixel units.

Figure 3:
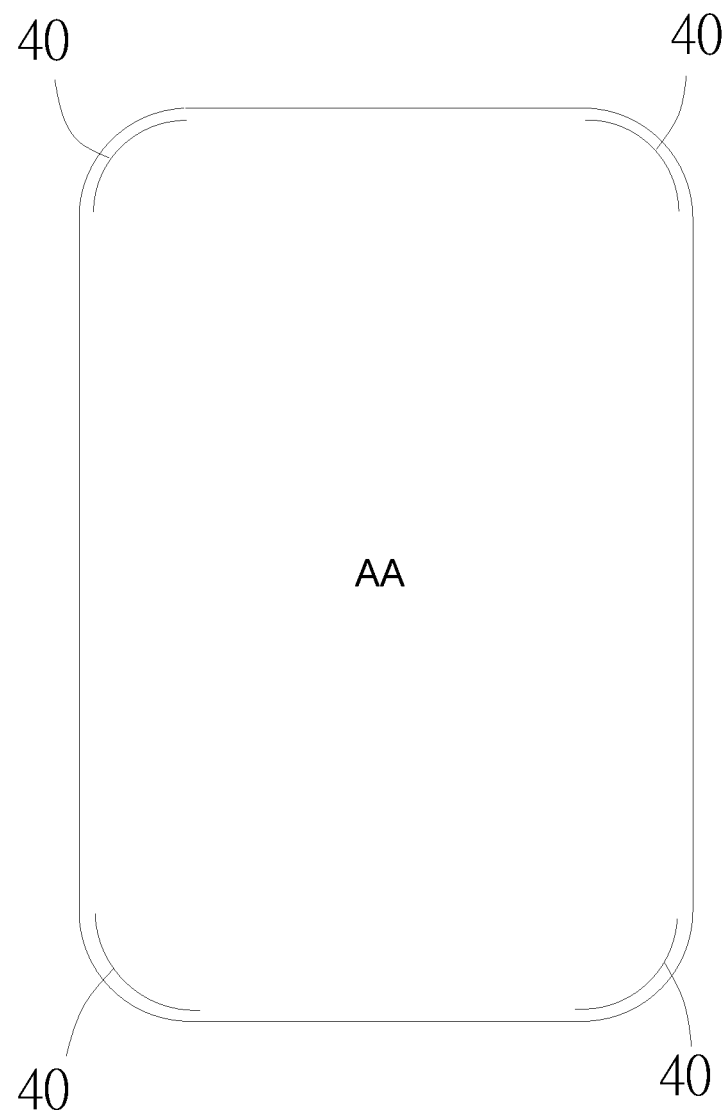
FIG. 3 illustrates a pixel color shift phenomenon generated at the round-corner edge pixel unit.

There is no regular arrangement for a round-corner edge pixel unit 30 due to the radius of the round-corner edge and the curvature of the round-corner edge. When a screen image is displayed, a pixel color shift phenomenon 40 as illustrated in FIG. 3 may be generated at the round-corner edge pixel unit 30. There is no regular rule of the arrangement of the R, G, and B pixels at the round-corner edge pixel unit 30; for example, one or two of the R, G, and B pixels may be missing in any one of the round-corner edge pixel units 30. When the round-corner edge pixel unit 30 receives the standard image display control signal, the predetermined displayed image does not coincide with the image display control signal due to lack of the R, G, and B pixels. Using the image algorithm simply to control the image display control signals of the pixel unit 30 at the round-corner edge will result in a uniform display of colors in a variety of different display requirements, resulting in the generation of a pixel color shift phenomenon 40.

Figure 4:
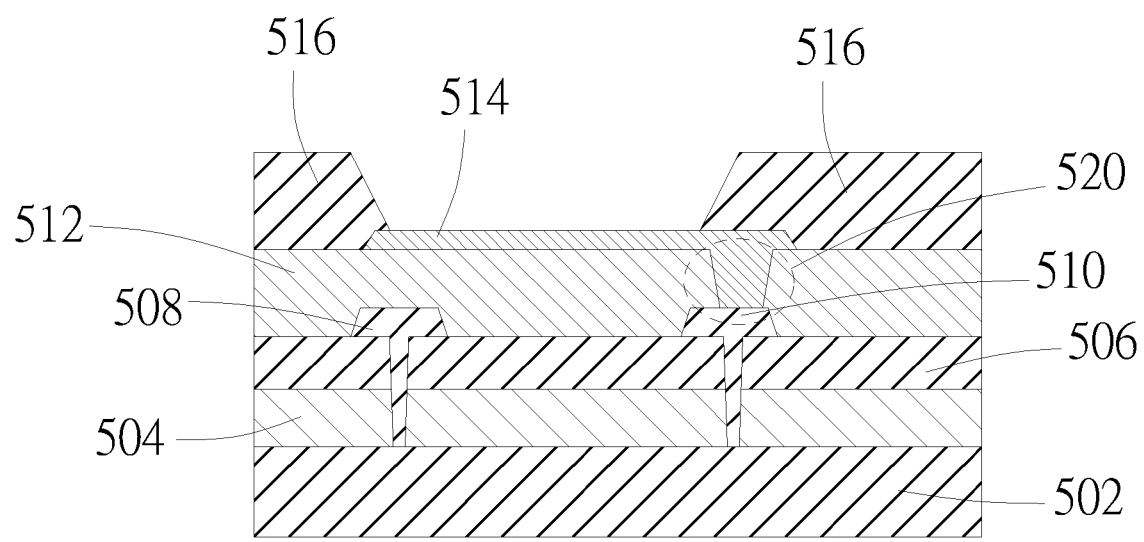
FIG. 4 is a schematic diagram of a standard pixel structure of an AMOLED display panel according to the present embodiment of the disclosure.

FIG. 4 is a schematic diagram of a standard pixel structure of an AMOLED display panel according to the present embodiment of the disclosure. A poly-silicon and gate layer 504 is arranged on the substrate 502. The substrate 502 may be made of a polyimide (PI) material. An interlayer insulating layer 506 is arranged on the substrate 502 and the poly-silicon and gate layer 504. An etching process is performed on the interlayer insulating layer 506 and the poly-silicon and gate layer 504 and areas corresponding to the source layer 508 and the drain layer 510 to form a hole. A source layer 508 and a drain layer 510 are formed in the holes in the areas corresponding to the interlayer insulating layer 506 and the poly-silicon and gate layer 504 and extend outside the hole. An insulating planar layer 512 is formed on the interlayer insulating layer 506, the source layer 508, and the drain layer 510. The planar layer 512 covers the interlayer insulating layer 506, the source layer 508, and the drain layer 510. An etching process is performed on areas corresponding to the planar layer 512 and the drain layer 510 to form a hole 520. An anode material layer 514 is formed on the planar layer 512. The anode material layer 514 extends through the hole 520 and is electrically connected to the drain layer 510. The anode material layer 514 can be made of an indium tin oxide (ITO) material. A pixel defining layer 516 is formed on the anode material layer 514. The pixel defining layer 516 covers only a portion of the anode material layer 514 to leave some of the surface of the anode material layer 514 for connection to other control circuitry. In the standard pixel structure, since the R, G, and B pixels are arranged in a regular pattern, an image display control signal can correspond to a normally displayed image. Therefore, the drain layer 510 extends through the hole 520 and is electrically connected to the anode material layer 514 to normally transmit an image display control signal.

Figure 5:
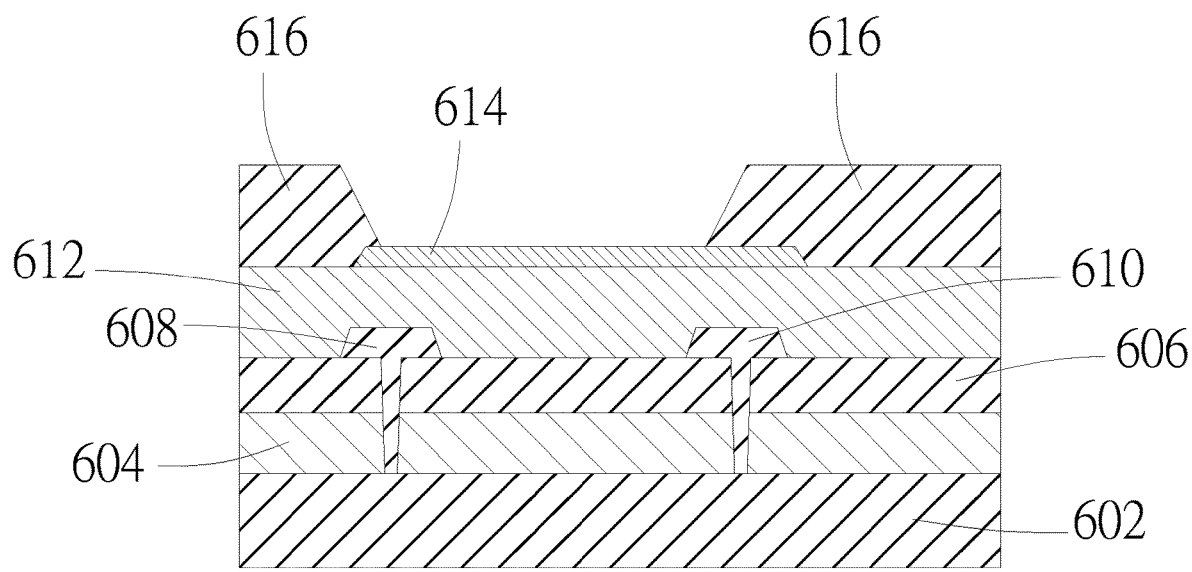
FIG. 5 is a schematic diagram of a non-standard pixel structure of an AMOLED display panel according to another embodiment of the disclosure.

FIG. 5 is a schematic diagram of a non-standard pixel structure of an AMOLED display panel according to another embodiment of the disclosure. A poly-silicon and gate layer 604 is arranged on the substrate 602. The substrate 602 may be made of a polyimide (PI) material. An interlayer insulating layer 606 is arranged on the poly-silicon and gate layer 604. An etching process is performed on the interlayer insulating layer 606 and the poly-silicon and gate layer 604 and areas corresponding to a source layer 608 and the drain layer 610 to form a hole. The source layer 608 and the drain layer 610 are formed in the holes in the areas corresponding to the interlayer insulating layer 606 and the poly-silicon and gate layer 604 and extend outside the hole. A planar layer 612 which is insulated is formed on the interlayer insulating layer 606, the source layer 608, and the drain layer 610. An anode material layer 614 is formed on the planar layer 612. The anode material layer 614 can be made of an indium tin oxide (ITO) material. A pixel defining layer 616 is formed on the anode material layer 614. The pixel defining layer 616 covers only a portion of the anode material layer 614 to leave some of the surface of the anode material layer 614 for connection to other control circuitry. Since the R, G, and B pixels in the non-standard pixel structure are not arranged in a regular pattern as in a standard pixel structure, the drain layer 610 and the anode material layer 614 are not provided with holes in the non-standard pixel structure. The drain layer 610 is not connected to the anode material layer 614. The AMOLED display panel can control pixel units of non-standard pixel structure by using image algorithm to prevent the color shift phenomenon that an image display control signal fails to correspond to a normally displayed image once the pixel unit of the non-standard pixel structure is received.

Based on the other designs of the AMOLED panel, the R, G, and B pixel units on the anode material layer of the non-standard pixel structure are in a floating state in the present disclosure. However, a hole is not formed on a pixel unit of the non-standard pixel structure at the round-corner edges so that the anode material layer can be connected to the source layer and the drain layer through the hole in the present disclosure. When the round-corner edge of the display panel is colored and displayed as purple, the R and B pixel units obscure the color of the G pixel unit. The G pixel unit obscures the color of the R and B pixel units so the round-corner edge of the display panel produces a color shift phenomenon and is displayed as a green/green bias. Some of the R, G, and B pixel units at the round-corner edge are not lit properly to display the normal R, G, and B colors are displayed normally by the image algorithm, thereby displaying the screen normally. In this way, the color shift is amended.

The present disclosure is not limited to the exemplary embodiments. It can also be implemented in other similar display screens with irregular edges or non-straight edges, for example, a smartphone with a bangs-shaped screen and a curved screen with an edge display area.

In conclusion, a color shift does not occur at the edge of the display area in an AMOLED panel proposed by an embodiment of the present disclosure to avoid color shift phenomenon at the edge of a display area. So red, green, and blue (R, G, and B) pixel units that are not arranged in a regular pattern at a non-standard pixel structure and a corresponding anode material layer are in a floating state. So the color shift phenomenon will not occur. When the pixel unit of the non-standard pixel structure receives an image display control signal, the color shift phenomenon may occur due to the inability to correspondingly display a corresponding image corresponding to the image display control signal to display the screen normally. The problem of the color shift phenomenon is resolved. Moreover, the structure proposed by the embodiment of the present disclosure is simple and effective in design, which meets industrial production requirements without an increase in production cost.

The present disclosure has been described with a preferred embodiment thereof. The preferred embodiment is not intended to limit the present disclosure, and it is understood that many changes and modifications to the described embodiment can be carried out without departing from the scope and the spirit of the disclosure that is intended to be limited only by the appended claims.

What is claimed is:

1. An active matrix organic light emitting diode (AMOLED) panel where a color shift does not occur at an edge of a display area, comprising:
   a substrate;
   a standard pixel structure, comprising:
      a first poly-silicon and gate layer is formed on the substrate;
      a first interlayer insulating layer, formed on the first poly-silicon and gate layer; wherein a first hole is formed through the first interlayer insulating layer and the first poly-silicon and gate layer; a first drain layer is formed filled with the first hole and extending outside the first hole;
      a first planar layer, formed on the first interlayer insulating layer, a first source layer, and the first drain layer; the first planar layer covering the first interlayer insulating layer, the first source layer, and the first drain layer; a second hole formed in the area corresponding to the first drain layer on the first planar layer;
      a first anode material layer, formed on the first planar layer, extending through the second hole, and electrically connected to the first drain layer; and
      a first pixel defining layer, formed on the first anode material layer and covering only a portion of the first anode material layer; and
   a non-standard pixel structure, comprising:
      a second poly-silicon and gate layer is formed on the substrate;
      a second interlayer insulating layer being formed on the second poly-silicon and gate layer;
      a second planar layer, formed on the second interlayer insulating layer, the second source layer, and the second drain layer; the second planar layer covering the second interlayer insulating layer, the second source layer, and the second drain layer;
      a second anode material layer, formed on the second planar layer; and
      a second pixel defining layer, formed on the second anode material layer; the second pixel defining layer, covering a portion of the second anode material layer,
   wherein The AMOLED display panel controls pixel units of non-standard pixel structure by using image algorithm.

2. The AMOLED panel according to claim 1, wherein red (R), green (G), and blue (B) pixel units in the standard pixel structure are arranged in a regular pattern.

3. The AMOLED panel according to claim 1, wherein the non-standard pixel structure lacks one or more of the R, G, and B pixel units.

4. The AMOLED panel according to claim 1, wherein the display area of the AMOLED panel comprises a non-straight edge.

5. The AMOLED panel according to claim 4, wherein the non-standard pixel structure is arranged at the non-straight edge.

6. The AMOLED panel according to claim 4, wherein the non-standard pixel structure is a round-corner edge.

7. The AMOLED panel according to claim 1, wherein the substrate is made of a polyimide (PI) material.

8. The AMOLED panel according to claim 1, wherein the first hole and the second hole are formed in an etching process.

9. The AMOLED panel according to claim 1, wherein the first anode material layer and the second anode material layer are both made of indium tin oxide (ITO).

* * * * *